May 3, 1955 C. R. GRAHAM 2,707,773

AUDIO FREQUENCY TRANSFORMER

Filed Aug. 15, 1952 2 Sheets-Sheet 1

Cecil R. Graham
INVENTOR.

BY Clarence A. O'Brien and Harvey B. Jacobson
Attorneys

May 3, 1955

C. R. GRAHAM 2,707,773

AUDIO FREQUENCY TRANSFORMER

Filed Aug. 15, 1952

2 Sheets-Sheet 2

Cecil R. Graham
INVENTOR.

BY Clarence A. O'Brien
and Harvey B. Jacobson
Attorneys

United States Patent Office 2,707,773

Patented May 3, 1955

2,707,773

AUDIO FREQUENCY TRANSFORMER

Cecil R. Graham, New York, N. Y.

Application August 15, 1952, Serial No. 304,485

6 Claims. (Cl. 333—77)

This invention relates to an audio frequency transformer and particularly to an audio frequency transformer having a high gain and high fidelity throughout the entire audio frequency range. In the construction and operation of audio frequency transformers as heretofore known it has been found that certain frequencies operate with a better gain and fidelity than other frequencies in the audio frequency band. Therefore, it has been found that in order to have a high gain ratio the fidelity or the reproduction of the various frequencies of the band has been poor. Consequently, it has been necessary to use a low gain transformer in order to gain the high fidelity desired or sacrifice fidelity in order to gain the proper gain ratio.

The present invention provides an audio frequency transformer operative over a wide range band having a high fidelity and high gain ratio for each wave length in the band.

This is accomplished by providing a transformer having a plurality of primary taps and wave frequency means for controlling the turn ratio in the transformer employed by the various wave length or wave frequencies. The increase in turn ratio for the low frequencies is accomplished by means of the tuned frequency by-pass over the portion of the transformer so that a frequency of a particular wave length will be impressed on only a portion of the turns of the primary winding so that the effective turn ratios for the particular frequency or particularly the low frequency will be very high.

Tuning circuits are preferably provided by means of iron core reactors connected to taps in the primary winding of the transformer by means of capacitors so that the capacitor reactance combination is tuned to the particular frequency so that that frequency is impressed on a given portion of the primary winding and shunted around the remaining portion of the winding. This produces an exceptionally strong primary current in that portion of the winding through which it flows so that the reproduction of that frequency in the secondary winding will be extremely strong. In this manner each of the frequencies of the audio frequency band may be individually stepped up so that each frequency has a high gain ratio as well as high fidelity in the transformer.

It is accordingly an object of the invention to provide a high gain-high fidelity audio frequency transformer.

It is a further object of the invention to provide an audio frequency transformer having tuned frequency by-passes over portions of the transformer winding.

It is a further object of the invention to provide an audio frequency transformer having a frequency cut-off to prevent overloading of the electronic tubes.

Other objects and many of the attendant advantages of the present invention will be apparent from the following detailed description taken in conjunction with the accompanying drawing in which.

Figures 1, 5:
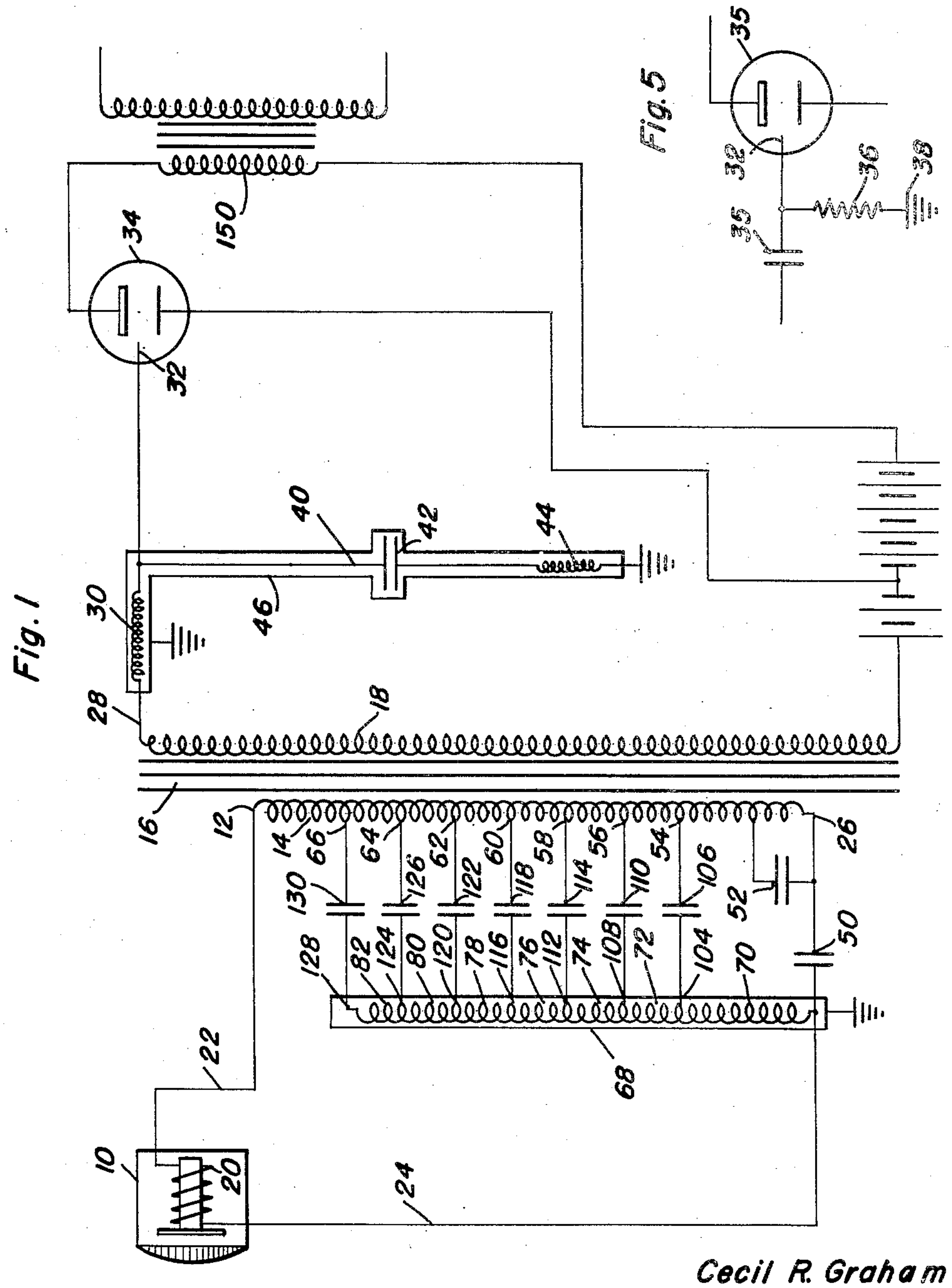
Figure 1 is a schematic wiring diagram of a high-fidelity-high gain audio frequency transformer according to the invention.
Figure 5 is a schematic view of an alternate tube protector.
Figure 2:
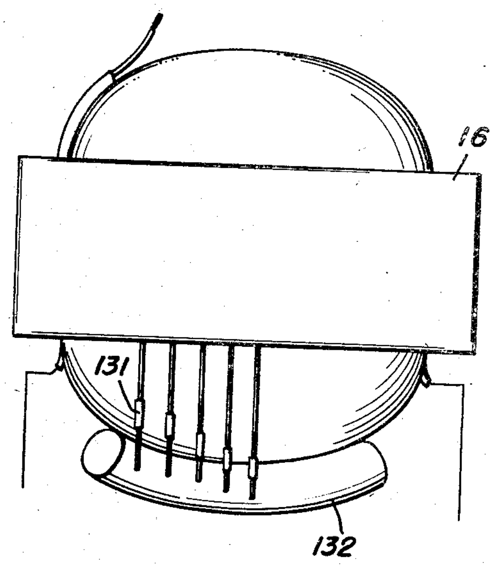
Figure 2 is a top plan view of the transformer.
Figure 3:
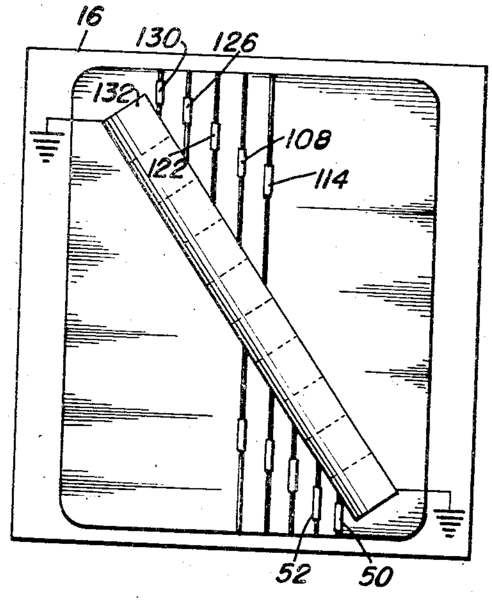
Figure 3 is a front elevational view of the transformer.
Figure 4:
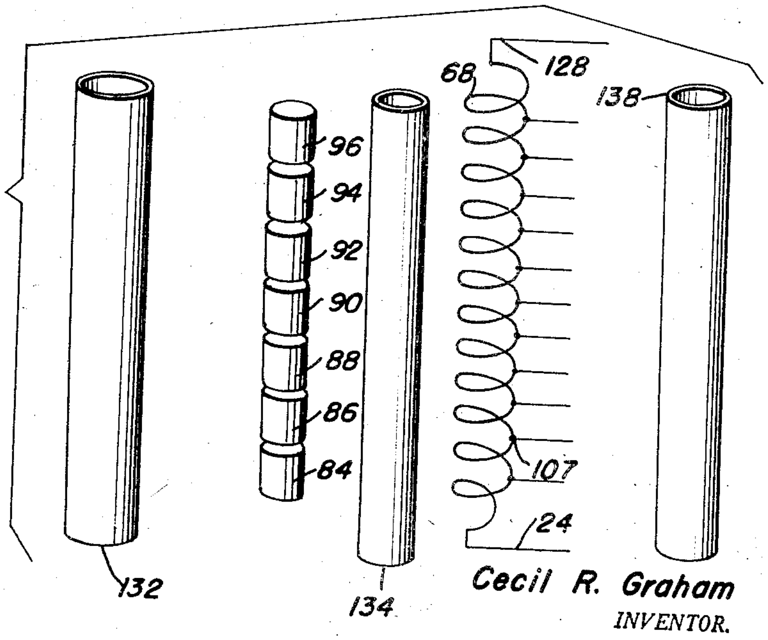
Figure 4 is an exploded view of the low frequency tap for the transformer.

In the exemplary embodiment a source of audio frequency vibrations such as a microphone 10 is connected to the input terminal 12 of a primary winding 14 of an audio frequency transformer having a core 16 and a secondary winding 18. In an exemplary embodiment the microphone 10 is provided with a voice coil 20 having one conductor 22 connected to the input terminal 12 and another terminal 24 is connected to an input terminal 26. An output terminal 28 of the secondary winding 18 is connected through a loading impedance 30 and impressed on a grid 32 of an electronic tube 34. A tuned by-pass 40 includes a capacitor 42 and a series connected impedance 44 connected to the ground. Series reactor 30 as well as the by-pass tune circuit 40 is enclosed in a shield 46 which is also connected to the ground.

The terminal 26 is connected through a capacitor 50 to the terminal 24 of the voice coil 20 so that extremely high frequencies will go through the coil 14 and the capacitor 50 to provide a complete circuit for the high frequency oscillations. A second by-pass condenser 52 provides a secondary capacitor circuit for a second high frequency by shunting out a portion of the primary winding 14.

The lower frequencies are provided with shunt paths by means of the taps 54, 56, 58, 60, 62, 64 and 66, tuned by-pass connections are provided to the taps 54 to 66 by means of a reactance 68 which comprises a plurality of series connected coils 70, 72, 74, 76, 78, 80 and 82. The individual coils 70 to 82 being provided with separate distinct iron cores 84 to 96 inclusive. The tap 54 is connected to an intermediate tap 104 by means of a capacitor 106 to provide a tuned path for the wave length shorter than the wave length path through capacitor 52 so that the shorter wave length going through the coil 70 and the capacitor 106 will only transverse the number of coils between the terminal 12 and the tap 54 so that the lower frequency is carried by a lesser number of primary coils to produce a high turn ratio between the number of coils carrying that frequency and the coils of the secondary 18.

Likewise, tap 56 is connected to terminal 108 through transformer 110 while tap 58 is connected to terminal 112 through capacitor 114. Likewise, tap 60 is connected to tap 116 through capacitor 118, tap 62 to connection 120 through capacitor 122 and tap 64 through tap 124 through capacitor 126 while the final tap 66 is connected to the outer terminal of the coil 82 of the impedance 68 by means of capacitor 130.

The entire reactance 68 is provided with an external metal shield 132. The entire structure is preferably provided as having a plurality of cores 84 to 96 on which is placed an insulated winding such as a paper tube 134 over which the winding 68 is placed with the taps 104 to 128. Insulating tube 34 serves a function of maintaining the cores 84 to 96 in position and also in providing electrical insulation between the turns of the impedance 68 and the iron cores contained in the tube 134. The second insulator 138 which is also preferably a paper tube is placed over the impedance 68 and under the metal shield 132 not only to prevent stray flux from entering the coils 68 but also to insulate the coils for any possible contact with the metal shield 132.

As is well known the windings 14 and 18 are placed on the cores 16 so that substantially all of the flux produced by the coil 14 will be conducted through the coils of the secondary winding 18. The impedance 68 is provided on the outside of the coils on the transformer cores 16. Suitable openings are provided in the shield 132 for the taps 104 to 128 to be extended through. The capacitors 106 to 130 are connected in series between the taps of the transformer windings and the terminals of the various coils in the shield 132 and the connections including the transformers 106 are so arranged that the conductors lie in the path of the flux in the windings 14 and 18 so that no stray voltages will be generated in the connections between the taps 54 to 66 and the terminals 104 to 128.

The shield 132 together with the cores and windings contained therein is arranged at an angle of 90° to the transformer windings so that a minimum of interference will be had between the reactor 68 and the windings 14 and 18.

In the operation of the high fidelity-high gain transformer a voice or other sound device is converted by means of the microphone 10 and the voice coil 20 into a series of electrical vibrations having the frequency of the audio tones impressed thereon. The higher frequency tones will traverse the entire winding 14 and one of the capacitors 50 and 52 and return to the coil over the winding 24. The lower frequencies each according to its turn will be shunted over one of the branch low frequency tune circuits so that the low frequency waves will traverse only a portion of the winding 14 so that will be a higher turn ratio for the low frequencies than the high frequencies so that the maximum low frequency current can flow in the primary winding of a high turn ratio to produce the maximum effect in the secondary winding 18. The generated frequencies in secondary winding 18 will be impressed on the grid 32 of the electronic tube 34 so that a high amplifying factor will be produced on the second stage transformer primary 150. Obviously, the winding 150 may likewise be provided with a frequency shunt so that it will also be a high fidelity-high gain transformer.

The series impedance 30 and together with the tune shunt 40 serve to cut-off higher frequencies than the frequencies passing through the transformer winding 18 or which can be taken by the electronic tube 34 to prevent blocking of the tube because of high frequency surges into the tube 34.

In less exacting work such as public address systems the loading reactor 30 and associated shunt 40 may be omitted and output terminal 28 connected to grid 32 by a series capacitor 35 with a ground shunt impedance 36 connected to ground at 38.

It will thus be seen that the present invention provides an audio frequency transformer having a high fidelity over the entire audio frequency band and also having a high gain ratio because of the high turn ratio in the primary of the transformer.

For purpose of exemplification a particular embodiment of the invention has been shown, and described according to the best present understanding thereof. It will be apparent to those skilled in the art that changes and modifications can be made therein without departing from the true spirit of the invention.

Having described the invention, what is claimed as new is:

1. An audio frequency band pass transformer comprising a primary and a secondary winding, input terminals on said primary winding, a plurality of intermediate taps in said primary winding, a plurality of series connected impedance coils, individual iron cores in said coils, capacitors connected between the taps and the junction points of said coils, one end of said series connected coils being connected to one of said input terminals, said iron cores being arranged in spaced end to end relation.

2. An audio frequency band pass transformer comprising a primary and a secondary winding, input terminals on said primary winding, a plurality of intermediate taps in said primary winding, a plurality of series connected impedance coils, individual iron cores in said coils, capacitors connected between the taps and the junction points of said coils, one end of said series connected coils being connected to one of said input terminals, said iron cores being arranged in spaced end to end relation, a metallic stray flux shield enclosing said series connected coils, said shield being grounded.

3. An audio frequency band pass transformer comprising a primary and a secondary winding, input terminals on said primary winding, a plurality of intermediate taps in said primary winding, a plurality of series connected impedance coils, individual iron cores in said coils, capacitors connected between the taps and the junction points of said coils, one end of said series connected coils being connected to one of said input terminals, said iron cores being arranged in spaced end to end relation, a metallic stray flux shield enclosing said series connected coils, said shield being grounded, a reactance coil connected in series with said secondary winding, a capacitor and reactor connected in series circuit relation between the outside terminal of said reactance coil and ground.

4. An audio frequency band pass transformer comprising a primary and a secondary winding, input terminals on said primary winding, a plurality of intermediate taps in said primary winding, a plurality of series connected impedance coils, individual iron cores in said coils, capacitors connected between the taps and the junction points of said coils, one end of said series connected coils being connected to one of said input terminals, said iron cores being arranged in spaced end to end relation, a metallic stray flux shield enclosing said series connected coils, said shield being grounded, a reactance coil connected in series with said secondary winding, a capacitor and reactor connected in series circuit relation between the outside terminal of said reactance coil and ground, a common magnetic shield enclosing said reactance coil and said series circuit.

5. An audio frequency band pass transformer comprising a primary and a secondary winding, input terminals on said primary winding, a plurality of intermediate taps in said primary winding, a plurality of series connected impedance coils, individual iron cores in said coils, capacitors connected between the taps and the junction points of said coils, one end of said series connected coils being connected to one of said input terminals, said iron cores being arranged in spaced end to end relation, a metallic stray flux shield enclosing said series connected coils, said shield being grounded, said coils being disposed in oblique relation to the flux produced in said transformer, the connections between said taps and said coils being disposed parallel to the flux produced by said transformer.

6. An audio frequency band pass transformer comprising a primary and a secondary winding, input terminals on said primary winding, a plurality of intermediate taps in said primary winding, a frequency turn ratio selector including a plurality of series connected impedance coils, capacitors connected between the taps and the respective junction points of said coils, one end of said series connected coils being connected to one of said input terminals, individual iron cores in each of said coils, a stray flux shield enclosing said coils, insulation between said cores and said coils, insulation between said coils and said shield.

References Cited in the file of this patent

UNITED STATES PATENTS

| | | |
|---|---|---|
| 1,389,148 | McConahey | Aug. 30, 1921 |
| 1,394,910 | Kierstead | Oct. 25, 1921 |
| 1,954,943 | Norton | Apr. 17, 1934 |
| 2,002,187 | Posthumus | May 21, 1935 |
| 2,180,413 | Harvey | Nov. 21, 1939 |
| 2,239,136 | Wheeler | Apr. 22, 1941 |
| 2,462,884 | Miller, Jr. | Mar. 1, 1949 |
| 2,475,909 | Morrison | July 12, 1949 |
| 2,483,801 | Becwar | Oct. 4, 1949 |